(12) United States Patent
Allais et al.

(10) Patent No.: US 8,644,899 B2
(45) Date of Patent: Feb. 4, 2014

(54) COATED CONDUCTOR

(75) Inventors: Arnaud Allais, Bonn (DE); Mark O. Rikel, Huerth (DE); Jürgen Ehrenberg, Huerth (DE); Christian-Eric Bruzek, Thun St Martin (FR)

(73) Assignee: Nexans, Paris (FR)

( * ) Notice: Subject to any disclaimer, the term of this patent is extended or adjusted under 35 U.S.C. 154(b) by 529 days.

(21) Appl. No.: 12/836,775

(22) Filed: Jul. 15, 2010

(65) Prior Publication Data
US 2012/0015815 A1 Jan. 19, 2012

(51) Int. Cl.
*H01L 39/24* (2006.01)
*H01B 12/00* (2006.01)

(52) U.S. Cl.
USPC ........... 505/230; 505/236; 505/237; 505/238; 505/430; 505/433; 174/125.1; 29/599

(58) Field of Classification Search
USPC ........ 505/230, 234, 236–238, 430, 433, 434, 505/470, 704; 174/125.1; 29/599
See application file for complete search history.

(56) References Cited

U.S. PATENT DOCUMENTS

| | | | | |
|---|---|---|---|---|
| 2002/0144838 | A1* | 10/2002 | Fritzemeier et al. | 174/125.1 |
| 2005/0181954 | A1* | 8/2005 | Buczek et al. | 505/329 |
| 2008/0119365 | A1 | 5/2008 | Allais et al. | |

FOREIGN PATENT DOCUMENTS

| | | | | |
|---|---|---|---|---|
| DE | 19724618 | | 12/1998 | |
| EP | 2131407 | A1 * | 12/2009 | H01L 39/14 |

OTHER PUBLICATIONS

Verebelyi et al, "Practical neutral-axis conductor geometries for coated conductor composite wire," Supercond. Sci. Technol. 16 (2003) 1158-1161.*
Laan, "YBa2Cu3O7-d coated conductor cabling for low ac-loss and high field magnet applications," Superconductor Science and Technology, 22 (2009) 065013 (5 pp).*

* cited by examiner

*Primary Examiner* — Stanley Silverman
*Assistant Examiner* — Kallambella Vijayakumar
(74) *Attorney, Agent, or Firm* — Sofer & Haroun, LLP

(57) ABSTRACT

A coated conductor with a substantially round cross section has a high temperature superconductor layer which is sandwiched between an inner substrate layer and an outer substrate layer to place the high temperature superconductor layer in the region of neutral strain axis.

12 Claims, 2 Drawing Sheets

COATED CONDUCTOR

RELATED APPLICATION

This application claims priority to European Patent Application No. 09 305 752.9, filed on Aug. 13, 2009, the entirety of which is incorporated by reference.

BACKGROUND

1. Field of the Invention

The present invention relates to a high temperature superconductor (HTS), in particular to a high temperature superconductor known as coated conductor as well as to a process for the production of a coated conductor allowing improved freedom of shaping of the coated conductor.

2. Description of Related Art

Coated conductors, which are also referred to as "second generation super-conductors", typically have a shape of long length with plane faces such as a tape or stripe. They are composed of a multi-layer structure with a substrate, a superconductor layer and, according to need, one or more buffer layers between the substrate and the superconductor layer with the layers being deposited onto a plane face of the substrate. The buffer layer(s) serve to compensate for the various different properties of the materials used. Typical coated conductor structures require several buffer layers. Finally, onto the superconductor layer a metallic protection layer may be deposited to complete the whole conductor structure.

High temperature superconductors, such as coated conductors, are promising candidates for a plurality of applications for power transmission cables, rotor coils of motors and generators, and windings of transformers, fault current limiters as well as for magnets for medical magnetic resonance imaging (MRI).

It is known in the production of HTS-cables to wind a tape-shaped coated conductor helically around a former.

One major problem in the production of coated conductors is the orientation or alignment of the crystal grains of the superconductor material which should be close to single-crystalline perfection in order to have high current carrying properties such as critical current density (Jc) and critical current (Ic) in the superconducting state. Alignment is also referred to as texture, which means that the orientation of the crystal grains is not random, but has a preferred direction. It is worth distinguishing in-plane and out-of-plane texture, Preferably, the superconductor layer should have a biaxial texture with the crystal grains being aligned both in-plane and out-of-plane.

The quality of biaxial texture is typically expressed in terms of the crystallographic in-plane and out-of-plane grain-to-grain misorientation angle which reflects the degree of inclination of individual crystal grains against each other. The smaller the misorientation angle the better the texture of the layer. The degree of texture can be determined by X-ray diffraction specifying the in-plane and out-of-plane orientation distribution function of the grains of the layer. Based on the X-ray data the values of the full-width-half-maximum (FWHM) of the in-plane phi scan ($\Delta\phi$) and out-of-plane rocking curve ($\Delta\omega$) can be obtained. The smaller the respective FWHM-value the better the texture. Typically, the misorientation angles should be less than about 10 degrees and, in particular, less than about 5 degrees.

Currently, there are two main approaches to achieve the desired texture. According to the first approach a highly textured buffer layer is deposited onto a polycrystalline, randomly oriented substrate by directed physical coating processes such as ion beam assisted deposition (IBAD). The highly textured buffer layers serve to transfer the desired texture to the superconductor layer grown onto the buffer layer.

According to the second approach a highly textured substrate is used which can be obtained by mechanical working, for example by RABiTS (Rolling assisted biaxial texturing of substrates). Here, the texture of the substrate is transferred to the buffer layer and, then, to the superconductor layer deposited thereon. Examples of metals suitable as substrate are copper, nickel, silver, iron and alloys thereof.

Though not restricted thereto, currently the rare-earth barium cuprate-type superconductors of the formula $REBa_2Cu_3O_{7-x}$ are conventionally used in the production of coated conductors with x representing the oxygen content in the range appropriate for the particular superconductor material. A preferred member thereof is that one known by the reference YBCO-123 wherein the numerical combination 123 stands for the stoichiometric ratio of the elements Y, Ba and Cu.

Typical buffer layers are ceramic oxides and include lanthanum zirconate, cerium oxide, yttrium-stabilized zirconia (YSZ), strontium titanium oxide, rare-earth aluminates and various rare-earth oxides.

Deposition techniques for the buffer layers as well as of the superconductor layer are well known in the art. Further, tape-like coated conductors and processes for manufacturing thereof are also well known in the art and are widely described.

Due to their ceramic nature the buffer layers and HTS layers are brittle. Further, the quality of the texture is very sensitive to stress. Thus, avoiding damage upon further processing such as shaping of a coated conductor is problematic. This problem of easy damage is increased since the HTS layers typically have thickness as small as about 0.5 to 3 $\mu m$ only.

For improving the mechanical robustness under bending stress in tape shaped coated conductors Verebelyi et al. in Supercond. Sci. Technol. 16 (2003) 1158 to 1161 and US 2002/144838 A1 of Fritzemeyer et al suggest bringing an over-layer onto the coated conductor, thereby bringing the high temperature superconductor layer in the region of the neutral axis. With this structure bending diameters around the transverse axis down to about 12 mm were obtained without impairment of the critical current. However, considering the width of the tape of about 12 mm the bending diameter on bending around the longitudinal axis would be about 3 to 6 mm which would impose by far more stress onto the material.

DE 197 24 618 A1 of Schippl et al. relates to a corrugated pipe with helical or ring corrugation obtained from a metal tape with a high temperature superconductor layer deposited thereon by forming the tape with the high temperature superconductor layer into a slotted pipe, closing the slot and corrugating the pipe. In this corrugated pipe impairment of the high temperature superconductor layer has been observed in the regions of the wave crests and valleys due to compression and stretching resulting from the corrugated structure. This problem is overcome by the provision of a further metal tape onto the tape with the high temperature superconductor layer with the further tape being significantly thicker than the first tape, for example about the 8 fold. Further, an adhesion promoting layer is provided between the high temperature superconductor layer and the further metal tape which provides sufficient mobility to the structure required for corrugation.

In this structure with the zone of neutral axis being within the further thicker tape a bending radius of about 6 mm (corresponding to a bending diameter of 12 mm) can be obtained without impairment of the high temperature superconductor layer. That is, this structure allows a bending in the order of the bending obtainable in Verebelyi and US 2002/144838 A1 referred to above.

Recently, also coated conductors with circular cross section, also referred to "round coated conductors" have been described wherein the substrate forms a core which is covered by the layer structure. The core may be hollow, such as a tube, or may be solid, such as a rod. For example, such "around coated conductors" and methods for production thereof are disclosed in US 2008/0119365 A1 and EP 1 916 720 A1 which are incorporated herein by reference. A typical method for producing a round coated conductor comprises the steps of forming a plane substrate into a round shape by bending the flat substrate around its longitudinal axis into a slot tube, optionally, texture annealing the shaped substrate, and subsequently depositing thereon the buffer and high temperature superconductor layers.

However, there is the problem that due to the bending stress the texture of the substrate is likely to be impaired. Further, as set out above the risk of damage is increased in case of a coated conductor with already deposited buffer and high temperature superconductor layers.

In the production of round coated conductors the tape-shaped coated conductor has to be bent around its longitudinal axis with very small bending angles corresponding to bending diameters of less than 4 mm down to about 1 mm only. The bending angles in the production of round coated conductors are significantly less than in the production of HTS cables, wherein bending is around the transverse axis as shown in FIG. 1. Thus, the forces generated and the risk of damage by bending the tape-shaped coated conductor around its longitudinal axis are considerably increased compared to the production of cables.

OBJECTS AND SUMMARY

The present invention relates to a round coated conductor obtainable by bending a pre-fabricated tape-shaped coated conductor with the buffer layers and high-temperature superconductor layer already deposited thereon, around its longitudinal axis and a process for bending a prefabricated tape-shaped coated conductor around its longitudinal axis without impairing mechanical integrity and the texture of the already deposited layers.

The present invention is directed to a coated conductor with essentially round cross section obtained from a pre-fabricated tape-shaped coated conductor with plane faces comprising a first substrate layer, a further second substrate layer and sandwiched there between a high temperature superconductor layer, by bending the tape-shaped coated conductor around its longitudinal axis, wherein the high temperature superconductor layer is sandwiched between the inside substrate layer and the outside substrate layer, and wherein the high temperature superconductor layer is located in the region of the neutral axis position.

Further, the present invention is directed to a process for producing a coated conductor with essentially round cross section comprising the steps of providing a second substrate layer onto the top most layer of a first pre-fabricated tape-shaped coated conductor for bringing the HTS layer of the first pre-fabricated conductor into the region of neutral axis position and, then, bending the pre-fabricated coated conductor covered by the second substrate layer around its longitudinal axis for obtaining a coated conductor with essentially round cross section with the HTS layer being sandwiched between the inside substrate layer and the outside substrate layer.

Typically the pre-fabricated tape shaped coated conductor comprises a substrate, a high temperature superconducting layer and, optionally, one or more buffer layer(s) located between the substrate and the high temperature superconductor layer.

Preferably at least one of the substrate and of the one and more buffer layer(s) of the pre-fabricated tape-shaped coated conductor has a biaxial texture.

"Region of neutral axis position" is intended to mean the region within a curved body obtained by bending a non-curved body which is free or almost free of forces generated in the body due to bending. As illustrated in FIG. 2 on bending a straight body oppositely directed forces are generated on the faces being opposite to each other in radial direction, i.e. tension stress is exerted on the radially outward face (here: lower face) and compression stress on the radially inward face (here: lower face).

Between the radially outward and inward faces is a region in which the now curved body maintained its original extension as indicated by the dotted line x and which is only slightly affected by strain.

Practically, the radial "size" of the region of neutral axis or deviation of the HTS layer from the ideal position can be defined through the strain level tolerable for the required application. In the particular case of HTS material, the strain in region of neutral axis should be tolerable with the Jc degradation. For technical coated conductors available on the market, Jc degradation of 10 and 50% are reached at the bending strain levels of about 0.5 and 1%, respectively. Assuming the tolerable strain level of 0.5%, the radial size of the neutral axis region in a round wire of 1 mm diameter is 5 µm.

Preferably, for the present invention the HTS layer is in a position of neutral axis region, wherein the deformation of the HTS layer is maintained in the range of 0.05 to 0.5%.

BRIEF DESCRIPTION OF THE DRAWINGS

The present invention is explained in more detail by reference to the accompanying drawings. These drawings are of illustrative nature only and do not mean any restriction of the present invention.

It is shown in

DETAILED DESCRIPTION

"Coated conductor with essentially round cross section" means that the shape of the cross sectional area can deviate from the ideal circular shape, for example maybe oval or even polygonal.

For the present invention any pre-fabricated tape-shaped coated conductor can be used comprising a flat substrate and a layer structure deposited onto a plane face of the flat substrate. The layer structure can comprise an HTS layer which is ready to be used that is which is already suitably textured. According to need one or more buffer layers can be present deposited between the substrate and the HTS layer. Moreover, as known in the art of coated conductors further layer can be deposited onto the HTS layer such as a metal protection layer.

For bringing the HTS layer in the neutral axis position a second substrate layer is applied onto the upper most layer of the pre-fabricated coated conductor.

The thickness of the second substrate should be within +/−5 µm, preferably within +/−0.5 µm of the thickness of the first substrate. Preferably, the second substrate is made of the same material as the substrate layer of the pre-fabricated coated conductor, also referred to first substrate layer.

However, it is not necessary that the second substrate layer has the same texture as the first substrate layer or even a texture at all.

Figure 1:
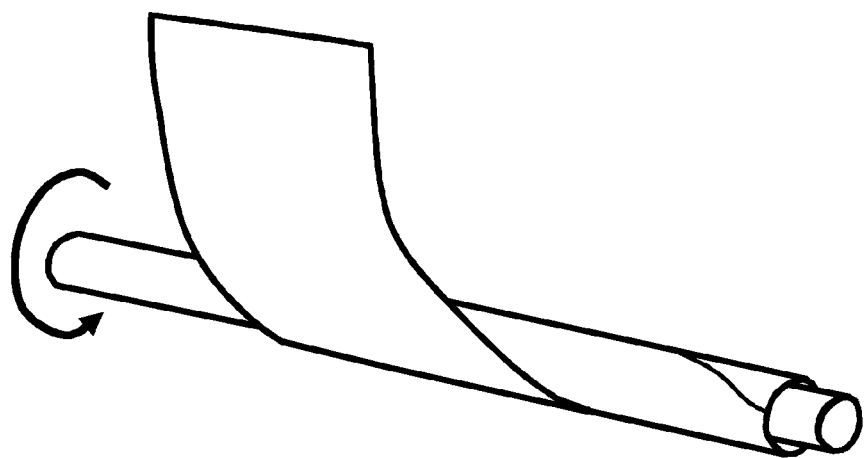
FIG. 1 a known HTS cable with a tape-shaped coated conductor being wound around a former.
Figure 2:
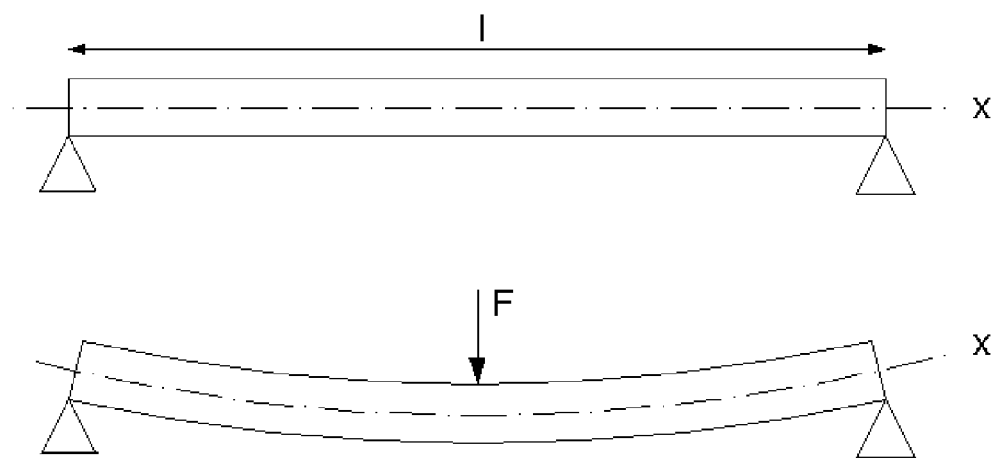
FIG. 2 an illustrative example for explaining "neutral axis position"
Figure 3:
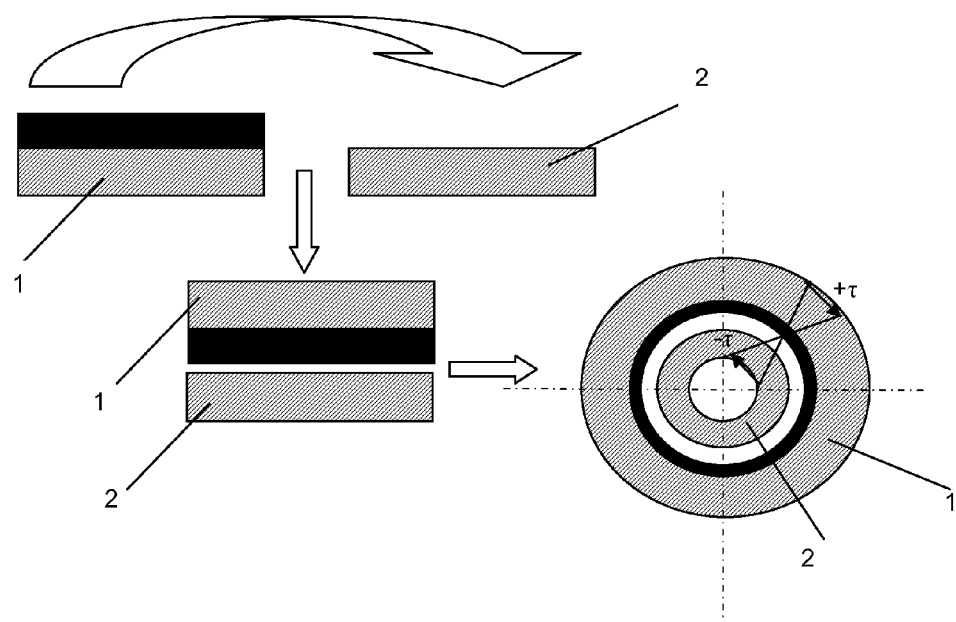
FIG. 3 an embodiment of the present invention.

FIG. 3 shows an illustration of an embodiment, wherein a first pre-fabricated coated conductor 1 is covered by a second substrate 2. Furthermore, in FIG. 3 the neutral axis position of the resulting coated conductor with essential round cross section is indicated with +τ and −τ being the stresses that exert on the outward and inward substrates, respectively, and the direction of stress being indicated by arrows.

According to the present invention round coated conductors can be obtained from tape-shaped coated conductors having a width of 10 mm or less down to about 4 mm corresponding to bending diameters of 3.2 mm and 1.3 mm, respectively. In particular, it is possible to obtain coated conductors with a bending diameter of about 1 mm.

Figure 4:
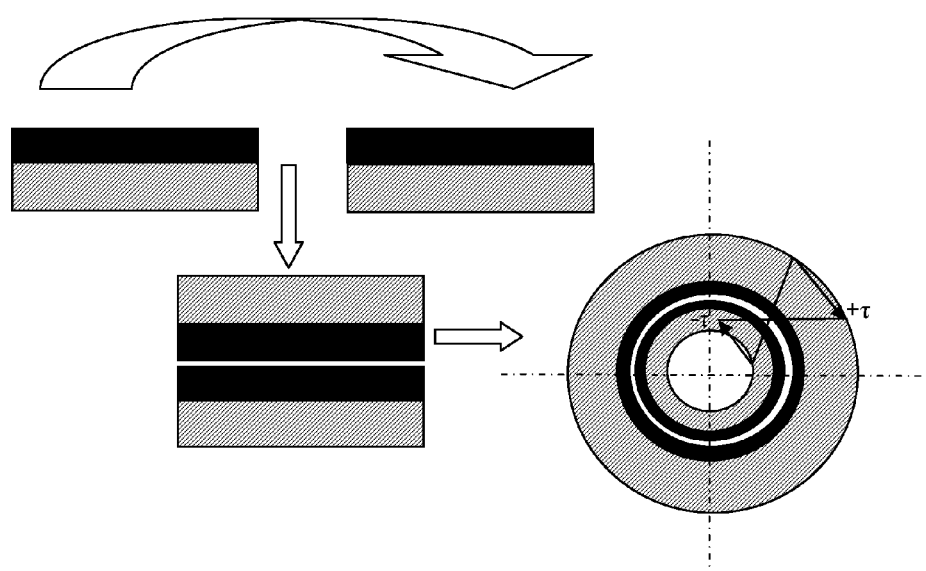
FIG. 4 a further embodiment of the present invention.

According to a preferred embodiment as shown in FIG. 4, the second substrate 2 can be a further pre-fabricated coated conductor which is applied onto the first coated conductor 1 with the HTS layer being face to face. In FIG. 4 the neutral axis position of the resulting coated conductor with essentially round cross section is indicated as in FIG. 3.

In case, that the second substrate is a pre-fabricated coated conductor, preferably, the layer structure of this further coated conductor equals the layer structure of the first coated conductor.

The second substrate can be bonded to the pre-fabricated coated conductor by soldering, diffusion bonding or any other suitable process.

The present invention is likewise applicable to coated conductor with randomly oriented substrate wherein texturing of the layers to be deposited is obtained by the deposition method used such as IBAD as well as to coated conductors with textured substrates wherein orientation of the layers to be deposited is obtained by epitaxial growth.

In principle, for the present invention any high temperature superconductor material may be used. Preferably, the high temperature superconductor material is a ceramic oxide high temperature superconductor material or $MgB_2$. Preferably, the ceramic oxide high temperature superconductor material is selected from the group consisting of bismuth-based, thallium-based, yttrium-based, and mercury-based ceramic oxide superconductors.

Typical examples comprise ceramic oxide high temperature superconductors based on Bi-Ae-Cu—$O_y$, (Bi,Pb)-Ae-Cu—$O_y$, Re-Ae-Cu—$O_y$, (Tl,Pb)-Ae-Cu—O or Hg-Ae-Cu—$O_y$. In each of the above formulas y represent the relative oxygen content in the range appropriate for the particular superconductor material, Ae means at least one alkaline earth element, particularly, Ba, Ca and/or Sr, Re means at least one rare earth element, particularly Y or a combination of two or more of the elements Y, La, Lu, Sc, Ce, Nd or Yb.

The ceramic oxide superconductor material can be a rare earth barium cuprate type-superconductor of the formula $ReBaCuO_y$ with Re and y are as defined above.

Alternatively, precursors of the superconductor materials can be used. Precursors are mixtures of oxides that collectively have the same nominal composition as the superconductor material and which form a superconductor material upon heating.

In particular, suitable ceramic oxide high temperature superconductors are those known by the reference BSCCO-2212, BSCCO-2223, wherein the numerical combinations 2212 and 2223 stand for the stoichiometric ratios of the elements Bi, Sr, Ca and Cu, preferably those, wherein part of Bi is substituted by Pb; and those known by the reference YBCO-123 and YBCO-211, wherein the numerical combinations 123 and 211 stand for the stoichiometric ratios of the elements Y, Ba and Cu.

Most preferably, the ceramic oxide high temperature superconductor material is YBCO-123.

Examples of metals suitable as substrate such as a tape or core are copper, nickel, silver, iron and alloys thereof, such as Ni-based alloys with at least one alloying component selected from W, Mo, Mn etc.

Typical buffer layers are ceramic oxides and include cerium oxide, yttrium-stabilized zirconia (YSZ), strontium titanium oxide, rare earth aluminates, oxides of general formula $Re_2A_2O_7$ with Re as defined above and A being selected from Zr and Hf, in particular $La_2Zr_2O_7$ (LZO) and various rare-earth oxides.

The metal protection layer is typically a noble metal or noble metal alloy, for example gold, silver, platinum and palladium or alloys thereof. Silver or silver alloys are preferred in view of their comparatively low costs.

Suitable methods for growing buffer layers for coated conductors include, for example, vacuum methods, such as physical vapor deposition (PVD), pulsed laser deposition (PLD), electron beam evaporation and sputtering as well as non-vacuum deposition processes such as chemical solution deposition (CSD), chemical vapor deposition (CVD) and metal organic chemical vapor deposition (MOCVD).

Suitable methods for depositing the superconductor layer include a wide variety of physical and chemical deposition processes, such as metal organic chemical vapor deposition, thermal evaporation, metal organic deposition and others.

For the present invention there is no particular restriction as to the deposition method of the buffer layers and the HTS layer. For example any of the methods referred to above can be used.

However, chemical non-vacuum techniques such as chemical solution deposition are preferred in view of reduced costs and higher deposition rate.

Suitable examples of CSD processes are
1. the metal organic decomposition (MOD) using metal-carboxylate compounds, in particular the trifluoroacetate (TFA) route using the metal trifluoroacetates as precursors,
2. the sol-gel-metal-organic route using metal alkoxides as precursors in organic solvents, and
3. the chelate processes which are a modification of the metal-organic-route.

The present invention provides more freedom of the final shape of a superconducting coated conductor. There is no restriction to the planar shape of the tapes as used currently. According to the present invention it is possible to obtain coated conductors with curved surfaces such as with round, elliptical or polygonal cross sectional area. For example, round or polygonal, such as hexagonal, cross sectional areas are advantageous for increasing the isotropy of the electrical properties and for facilitating the design and manufacturing for a specific application.

For forming and drawing forming techniques can be applied generally known for the working of metal sheets and metal tapes. Manufacturing of tubular coated conductors is known from EP 1 916 720 A1 which is included herein by reference.

Examples for suitable processes are rolling, drawing, welding etc.

In principle, for the present invention any conventional forming tool known in the art for the preparation of pipes or wires can be used. Typically, drawing dies with an opening through which the tape or wire is drawn, or forming tools are used which comprise pressure transfer media such as pairs of forming rollers or forming cylinders. Therewith the coated conductor tape is gradually deformed into the coated conductor of essentially round cross section. A further well known forming tool is called "turk head". A conventional turk head comprises four rollers as pressure transfer medium which are arranged symmetrically to each other at right angles.

For example, according to the present invention, the first pre-fabricated tape-shaped coated conductor covered with the second substrate can be formed to tubular shape by forming the composite along its longitudinal direction to a split tube with the longitudinal edges adjoining each other along a longitudinal split formed on deformation.

Thereby a HTS conductor wire can be obtained which can be further processed like a conventional wire.

On demand, the split can be closed, for example by welding.

Forming of the pre-fabricated tape-shaped coated conductor covered with the second substrate can be carried out around a central core of essentially tubular or wire shape. The central core can be preferably made of a metal such as steel, etc.

The obtained tube with central core can be drawn until the tube closely abuts on the central core.

On top of the HTS layer of superconducting material one or more further layer(s) may be deposited, e.g. metallic shunt layer, metallic protective layer and insulator layer.

The metallic shunt layer and the metallic protective layer may be deposited by electroplating and can be made from Ag, Au, Cu etc.

The insulator layer can be formed by extrusion of known insulators like polyester, polyetheretherketone (PEEK) etc.

The present invention is particularly useful in the production of coated conductors having very small bending diameters with a magnitude in the order of about 3.2 mm or less in particular, down to about 1 mm.

What is claimed is:

1. Process for producing a coated conductor with essentially round cross section comprising the steps of:
   providing a second substrate layer onto a topmost layer of a first pre-fabricated tape-shaped coated conductor wherein the first pre-fabricated tape-shaped coated conductor includes a first tape-shaped substrate and a high temperature superconductor layer, and optionally, at least one buffer layer located between the substrate and the high temperature superconductor layer, for bringing the high temperature superconductor layer of the pre-fabricated tape-shaped coated conductor into the region of neutral axis position; and
   bending the first pre-fabricated tape-shaped coated conductor covered by the second substrate layer around its longitudinal axis for obtaining a coated conductor with essentially round cross section with the high temperature superconductor layer being sandwiched between a second side substrate layer and a first outside substrate layer and wherein said high temperature superconductor layer is a continuous layer of essentially round cross section covering the substrate.

2. Process according to claim 1, wherein the second substrate layer is made from the same material than the substrate layer of the first pre-fabricated tape-shaped coated conductor and has the same thickness.

3. Process according to claim 1, wherein the second substrate layer is a further pre-fabricated tape-shaped coated conductor, and
   wherein the further pre-fabricated tape-shaped coated conductor is applied onto the first pre-fabricated tape-shaped coated conductor with the high temperature superconductor layers being face-to-face.

4. Process according to claim 1, wherein the high temperature superconductor is selected from the group consisting of bismuth-based, thallium-based, yttrium-based and mercury-based ceramic oxide superconductors.

5. Process according to claim 4, wherein the ceramic oxide high temperature superconductor has the general formula $ReBaCuO_y$, with Re being at least one rare-earth element selected from the group consisting of Y, La, Lu, Sc, Ce, Nd and Yb with y representing the oxygen content.

6. Process according to claim 5, wherein the high temperature superconductor material is $Y_1Ba_2Cu_3O_y$ or $Y_2BaCuO_y$.

7. Process according to claim 1, wherein at least one of the substrate and the at least one buffer layer of the first pre-fabricated tape-shaped coated conductor has a biaxial texture.

8. Process according to claim 1, wherein said first pre-fabricated tape-shaped coated conductor includes at least one buffer layer located between the tape-shaped substrate and the high temperature superconductor layer.

9. Coated conductor with a substantially round cross section obtainable by a process according to claim 1, wherein the coated conductor is composed of a first coated conductor having a substrate,
   a high temperature superconductor layer and, optionally, at least one buffer layer located between the substrate and the high temperature superconductor layer, and
   a further substrate layer,
   wherein in the coated conductor with substantially round cross section the high temperature superconductor layer is sandwiched between the substrate layer of the first coated conductor and the further substrate layer and wherein said high temperature superconductor layer is a continuous layer of essentially round cross section covering the substrate, and
   wherein the high temperature superconductor layer is located in the region of the neutral axis position.

10. Coated conductor according to claim 9, wherein at least one of the substrate and the at least one buffer layer of the first coated conductor has a biaxial texture.

11. Coated conductor according to claim 9, wherein the thickness of the further substrate is within +/−5 μm of the thickness of the substrate, of the first coated conductor.

12. Coated conductor according to claim 9, wherein the second substrate is a further pre-fabricated coated conductor.

* * * * *

UNITED STATES PATENT AND TRADEMARK OFFICE
CERTIFICATE OF CORRECTION

PATENT NO. : 8,644,899 B2
APPLICATION NO. : 12/836775
DATED : February 4, 2014
INVENTOR(S) : Allais et al.

It is certified that error appears in the above-identified patent and that said Letters Patent is hereby corrected as shown below:

In the Claims

Column 8, Claim 1, Line 4: The word "side" between the words "second," and "substrate," should be changed to "inside"

Signed and Sealed this
Twenty-ninth Day of April, 2014

Michelle K. Lee
*Deputy Director of the United States Patent and Trademark Office*